US008532313B2

(12) United States Patent
Wu

(10) Patent No.: US 8,532,313 B2

(45) Date of Patent: Sep. 10, 2013

(54) AUDIO PROCESSING SYSTEM FOR AN AUDIO OUTPUT DEVICE

(75) Inventor: Chun-Te Wu, Taipei Hsien (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 900 days.

(21) Appl. No.: 12/693,357

(22) Filed: Jan. 25, 2010

(65) Prior Publication Data

US 2011/0123047 A1 May 26, 2011

(30) Foreign Application Priority Data

Nov. 24, 2009 (CN) .......................... 2009 1 0310322

(51) Int. Cl.
*H03G 3/00* (2006.01)

(52) U.S. Cl.
USPC .......................................... 381/104; 381/107

(58) Field of Classification Search
USPC ............... 381/107, 104, 108, 120; 330/207 P
See application file for complete search history.

(56) References Cited

U.S. PATENT DOCUMENTS

2010/0202631 A1* 8/2010 Short ........................... 381/104

FOREIGN PATENT DOCUMENTS

| | | | |
|---|---|---|---|
| CN | 1664927 | A | 9/2005 |
| CN | 101102098 | A | 1/2008 |
| CN | 101114819 | A | 1/2008 |

* cited by examiner

*Primary Examiner* — Vivian Chin
*Assistant Examiner* — Friedrich W Fahnert
(74) *Attorney, Agent, or Firm* — Altis & Wispro Law Group, Inc.

(57) ABSTRACT

An exemplary audio processing system includes a gain control unit, a sampling unit, and a triggering unit. The gain control unit is configured for amplifying an audio signal. The sampling unit is configured for sampling the audio signal. The triggering unit is configured for generating a gain reduction unit if the amplitude exceeds a predetermined value over a predetermined time period. The first predetermined value is set so that if the amplitude of the audio signal exceeds the predetermined value and the gain of the gain control unit is not reduced, the amplitude of the amplified audio signal exceeds a predetermined acceptable range. The gain control unit is also configured for reducing the gain of the gain control unit responding to the gain reduction signal to limit the amplitude of the amplified audio signal within the predetermined acceptable range.

9 Claims, 3 Drawing Sheets

AUDIO PROCESSING SYSTEM FOR AN AUDIO OUTPUT DEVICE

BACKGROUND

1. Technical Field

The present disclosure relates to audio processing, and particularly, to an audio processing system to control an audio signal input to be within an acceptable range to an audio output device.

2. Description of Related Art

Transducers, such as speakers or earphones, typically have a maximum acceptable input limit. If the input of the transducers exceeds the maximum acceptable input limit, sound reproduction by transducer may be distorted and even fail.

Therefore, it is desirable to provide an audio processing system, which can overcome the above-mentioned limitations.

DETAILED DESCRIPTION

Figure 1:
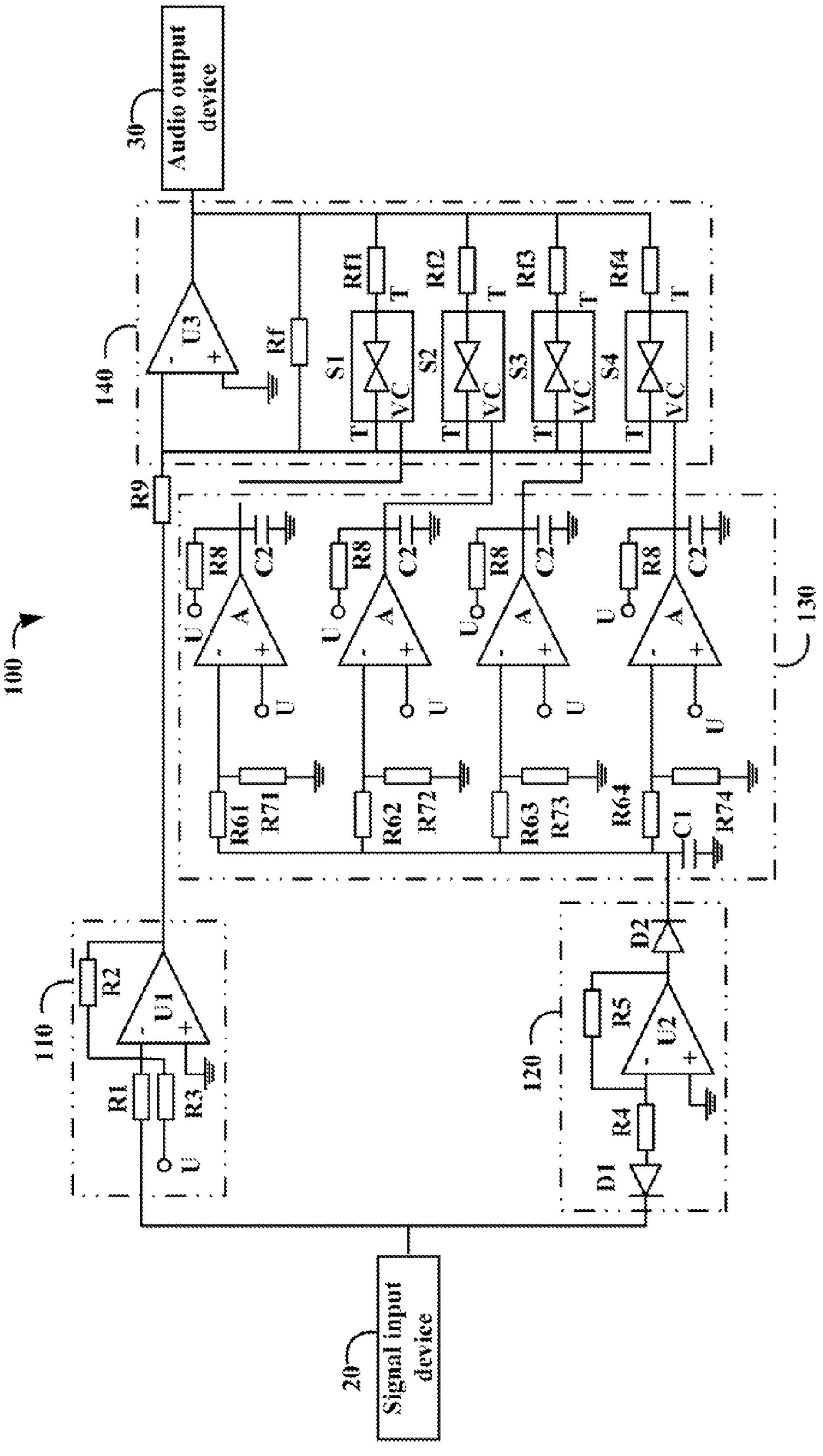
FIG. 1 is a circuit diagram of an exemplary embodiment of an audio processing system.

Referring to FIG. 1, an audio processing system 100, according to an exemplary embodiment, includes a direct current (DC) offset unit 110, a sampling unit 120, a triggering unit 130, and a gain control unit 140.

The DC offset unit 110 is connected to a signal input device 20. The signal input device 20 may comprise a system-on-chip (SoC) and other electronic elements that can produce an audio signal. The DC offset unit 110 receives the audio signal and is configured for offsetting the audio signal, to yield an offset audio signal.

The gain control unit 140 is connected to the DC offset unit 110 and an audio output device 30. The gain control unit 140 is configured for amplifying the offset audio signal, to yield an amplified audio signal, and outputting the amplified audio signal to the audio output device 30. The audio output device 30 can be a speaker or an earphone that reproduces the amplified audio signal into sound, and typically has an acceptable input range. If the amplified audio signal exceeds the acceptable range, the restoration of the sound is distorted or even fails.

The sampling unit 120 is also connected to the signal input device 20 and configured for sampling the audio signal, to yield a sampled audio signal.

The triggering unit 130 is connected to the sampling unit 120 and the gain control unit 140. The triggering unit 140 is configured for triggering a gain reduction signal if the amplitude (i.e., the voltage) of the sampled audio signal exceeds a predetermined value over a predetermined time period. The predetermined value is set so that when the voltage of sampled audio signal exceeds the predetermined value, the amplitude of the amplified audio signal by the audio processing system 10 exceeds the acceptable range of the audio output device 30. Therefore, the gain control unit 120 needs to reduce the gain thereof, according to the gain reduction signal, thus, limit/controlling the amplitude of the amplified audio signal to be within the acceptable range.

The DC offset unit 110 includes a first amplifier U1, a first resistor R1, a second resistor R2, and a third resistor R3. The negative input of the first amplifier U1 is connected to the signal input device 20 through the first resistor R1, and connected to the output of the first amplifier U1 through the second resistor R2, and connected to a DC voltage input U.

The sampling unit 120 includes a second amplifier U2, a first diode D1, a second diode D2, a fourth resistor R4, a fifth resistor R5. The negative input of the second amplifier U2 is connected to the signal input device 20 through the fourth resistor R4 and the first diode D1, wherein the cathode of the first diode D1 is directly connected to the signal input device 20. The negative input of the second amplifier U2 is also connected to the output of the second amplifier U2 through the fifth resistor R5. The positive input of the second amplifier U2 is grounded. The output of the second amplifier U2 is connected to the anode of the second diode D2.

The triggering unit 130 includes a first capacitor C1, four sixth resistor R6_i_ (i=1, 2, 3, 4), four seventh resistors R7_i_, four comparators Ai, four eighth resistors R8, and four second capacitors C2_i_. The first capacitor C1 is connected to the cathode of the second diode D2 and the ground. The negative input of each comparator Ai is connected to the cathode of the second diode D2 through a corresponding sixth resistor R6_i_, and connected to the ground through a corresponding seventh resistor R7_i_. The positive input of each comparator Ai is connected to the DC voltage input U. The output of each comparator Ai is connected to the DC voltage input U through a corresponding eighth resistor R8, and connected to the ground through a corresponding second capacitor C2_i_.

The gain control unit 140 is typically an inverse feedback amplifying circuit, and includes a third amplifier U3, a basic feedback resistor Rf, four controllable switches Si, and four additional feedback resistors Rfi. The negative input of the third amplifier U3 is connected to the output of the first amplifier U1 through a ninth resistor R9, and connected to the output of the third amplifier U3 through the basic feedback resistor Rf. The positive input of the third amplifier U3 is grounded. Each controllable switch includes two connection terminals T, and a control terminal VC. The two connection terminals T of each controllable switch electrically connect when a corresponding control terminal VC receives a logic high level (e.g., logical "1"), and disconnects when the corresponding control terminal VC receives a logic low level (e.g., logical "0"). One connection terminal T of each controllable switch Si is connected to the negative input of the third amplifier U3, and the other connection terminal T is connected to the output of the third amplifier U3 through a corresponding additional feedback resistor Rfi. The control terminal VC of each controllable switch Si is connected to the output of a corresponding comparator Ai.

Figure 2:
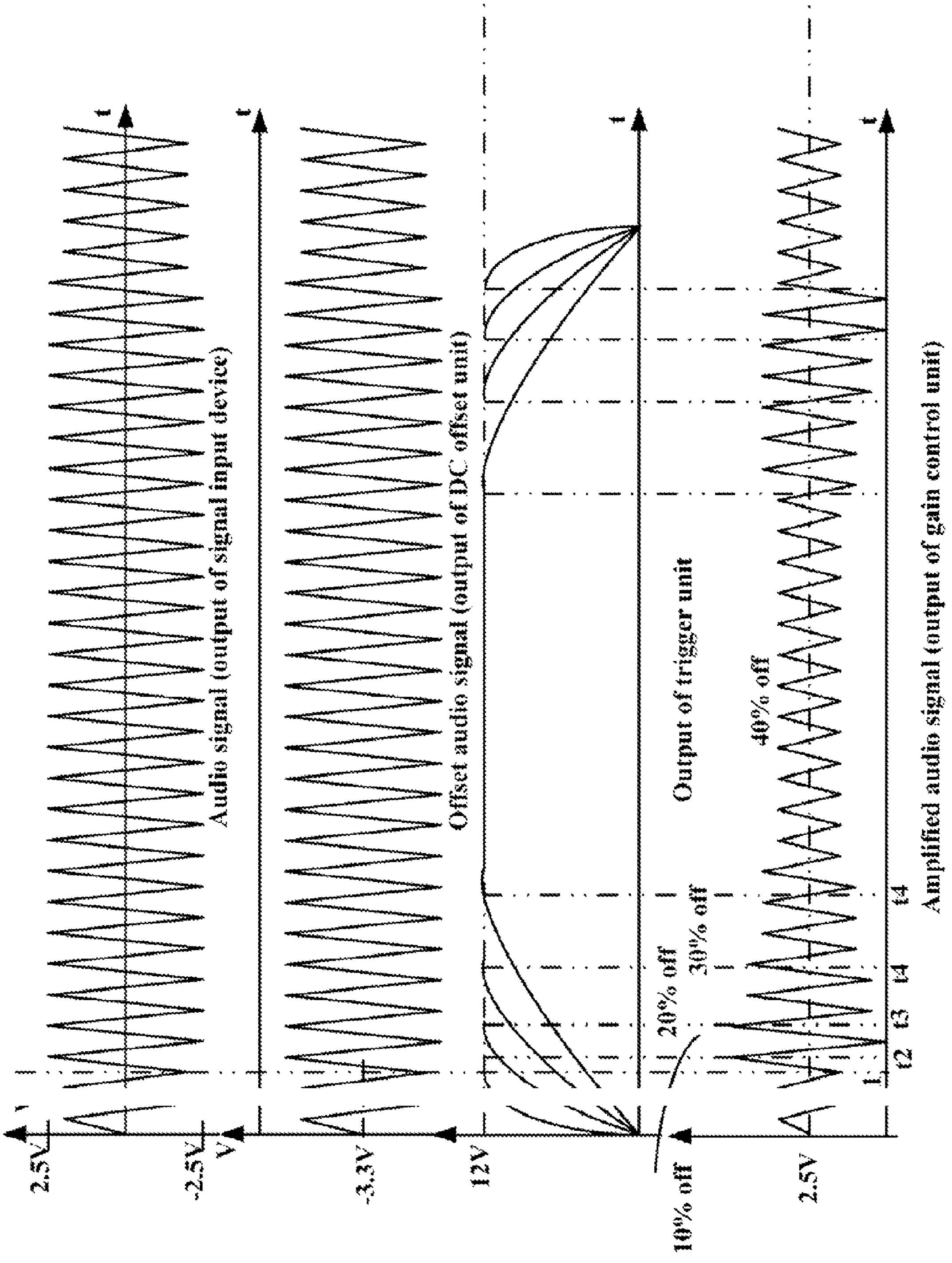
FIG. 2 is a waveform view showing one embodiment of the audio processing of the audio processing system of FIG. 1

Also referring to FIG. 2, in operation, the voltage of the audio signal is typically in a range of, for example, −2.5V to 2.5V. The acceptable input range is typically in a range of, for example, 0V to 5V. The gain control unit 140 is typically an inverse amplifying circuit. Therefore, the DC offset unit 110 is employed to facilitate signal processing of the gain control unit 140. It should be understood that if the range of voltage of the audio signal, the acceptable range, and the gain control unit 140 are different from this embodiment, the DC offset unit 110 can be omitted or replaced with other suitable preprocess circuits.

In this embodiment, considering the range of the audio signal, the acceptable range, and the gain of the gain control unit 140, the resistances of the first resistor R1, the second resistor R2, and the third resistor R3 set as about 10 KΩ. The DC voltage input U is set as about 3.3. As such, the DC offset of the offset audio signal (the mean of the offset audio signal) is about −3.3 V.

The first diode D1 samples a portion of the audio signal with negative voltage. The portion of the audio signal with negative voltage is amplified by the second amplifier U2. The second diode D2 is for outputting the sampled audio signal (i.e., the inversely amplified audio signal with negative voltage) and further protecting the sampling unit 120 from current reflux. In this embodiment, the resistances of the fourth resistor R4 and the fifth resistor R5 are 3 KΩ and 12 KΩ respectively.

The first capacitor C is a bypass filter used for filtering. Each sixth resistor R6*i* and a corresponding seventh resistor R7*i* divide the voltage of the sampled audio signal. However, the divided voltages of the seventh resistors R7*i* are different from each other because that the capacitances of the sixth resistors R6*i* are different and the capacitances of the seventh resistors R7*i* are the same. In one embodiment, the resistances of the sixth resistors R61, R62, R63, R64 may be about 5.9 KΩ, 8.45 KΩ, 11.8 KΩ, and 15.8 KΩ, respectively. The resistances of the seventh resistors R71, R72, R73, R74 may all be about 10 KΩ.

Since the divided voltage of the seventh resistor R71 is the highest among those of the seventh resistors R7*i*, therefore, once the voltage of the audio signal exceeds a first predetermined value. The divided voltage on the seventh resistor R71 will be the first to exceed 3.3V. The corresponding comparator Ai output a logic high level which charges the corresponding second capacitor C2*i*. If voltage of the audio signal remains above the first predetermined value over a first predetermined time period (e.g., t2-t1, see FIG. 2), the voltage on the second capacitor C21 exceeds the logic high level and that triggers the controllable switch S1. As a result, the two connection terminals T of the controllable switch S1 electrically connects. The additional feedback resistor Rf1 is parallely connected to the basic feedback resistor Rf. As such, the total feedback resistance of the gain control unit 140

$$\left(\frac{Rf \times Rf1}{Rf + Rf1},\right.$$

the resistance between the negative input and the output of the third amplifier U3) is weakened (original is Rf). Therefore, the gain of the gain control unit 140 reduces due to the reduction of the total feedback resistance.

In more detail, if the voltage of the audio signal exceeds a second predetermined value that is higher than the first predetermined value, the voltage on the second capacitor C22 exceeds the logic high level that triggers the controllable switch S2. As a result, the additional resistor Rf2 is also parallely connected with the basic feedback resistor Rf and the additional feedback resistor Rf1 too. The gain of the gain control unit 140 is further reduced. Similarly, if the voltage of the audio signal exceeds a third predetermined value (higher than the second predetermined value) and a fourth predetermined value (higher than the third predetermined value). The gain of the gain control unit 140 is further reduced.

The first predetermined value is set so that if the voltage of the audio signal exceeds the first predetermined value and the gain of the gain control unit 140 is not reduced, the voltage of the amplified audio signal would exceed the acceptable range. However, in this embodiment the gain of the gain control unit 140 is reduced when the voltage of the audio signal exceeds the first predetermined value. Therefore, the voltage of the amplified audio signal is controlled to be within the acceptable input range.

In one embodiment, the resistances of eighth resistors R8 may be about 4.7 KΩ, the capacitances of the second capacitors C2*i* may be about 0.1 uF, the resistances of the basic feedback resistor Rf may be about 10 KΩ, and the resistances of the additional feedback resistors Rf1, Rf2, Rf3, Rf4 may be about 92 KΩ, 72 KΩ, 56 KΩ, 42 KΩ, respectively. When the additional feedback resistor Rf1 is parallely connected with the basic feedback resistor Rf, the gain of the gain control unit 140 is weakened by about 10%. When the additional feedback resistor Rf2 is parallely connected with the basic feedback resistor Rf and the additional feedback resistor Rf1, the gain of the gain control unit 140 is weakened by about 20%. When the additional feedback resistor Rf3 is parallely connected with the basic feedback resistor Rf and the additional feedback resistors Rf1, Rf2, the gain of the gain control unit 140 is weakened by about 30%. Additionally, when the additional feedback resistor Rf4 is parallely connected with the basic feedback resistor Rf and the additional feedback resistors Rf1, Rf2, Rf3, the gain of the gain control unit 140 is weakened by about 40%.

In this embodiment, the first predetermined value is slightly higher than about 2V, and the fourth predetermined value is lower than about 2.5V. Therefore, referring to FIG. 2, from time t1, the voltage of the audio signal exceeds the fourth predetermined value, and all comparators Ai output the high logic level that charge the corresponding second capacitors Ci. At time t2, the voltage on the second capacitor C2 becomes higher than the high logic level that triggers the controllable switches Si, and the additional feedback resistor Rf1 is parallely connected with the basic feedback resistor Rf, the gain of the gain control unit 140 is weakened by about 10%. Similarly, the gain of the gain control unit 140 is about 20%, 30%, and 40% off starting from t3, t4, and t5 respectively.

It should be understood that disclosed circuit of the sampling unit 120 is corresponding to the disclosed circuit of the triggering unit 130. However, if other layouts of the triggering unit 130 are employed, the layout of the sampling unit 120 needs to be changed correspondingly.

It also should be understood that, not limited to this embodiment, more or less sets of sixth resistor R6*i*, the seventh resistor R7*i*, the comparator A1, the eighth resistor R8, the second capacitor C2*i*, the controllable switch Si and the additional resistor Rfi can be employed to obtain more levels of reduction of the gain of the gain control unit 140.

Figure 3:
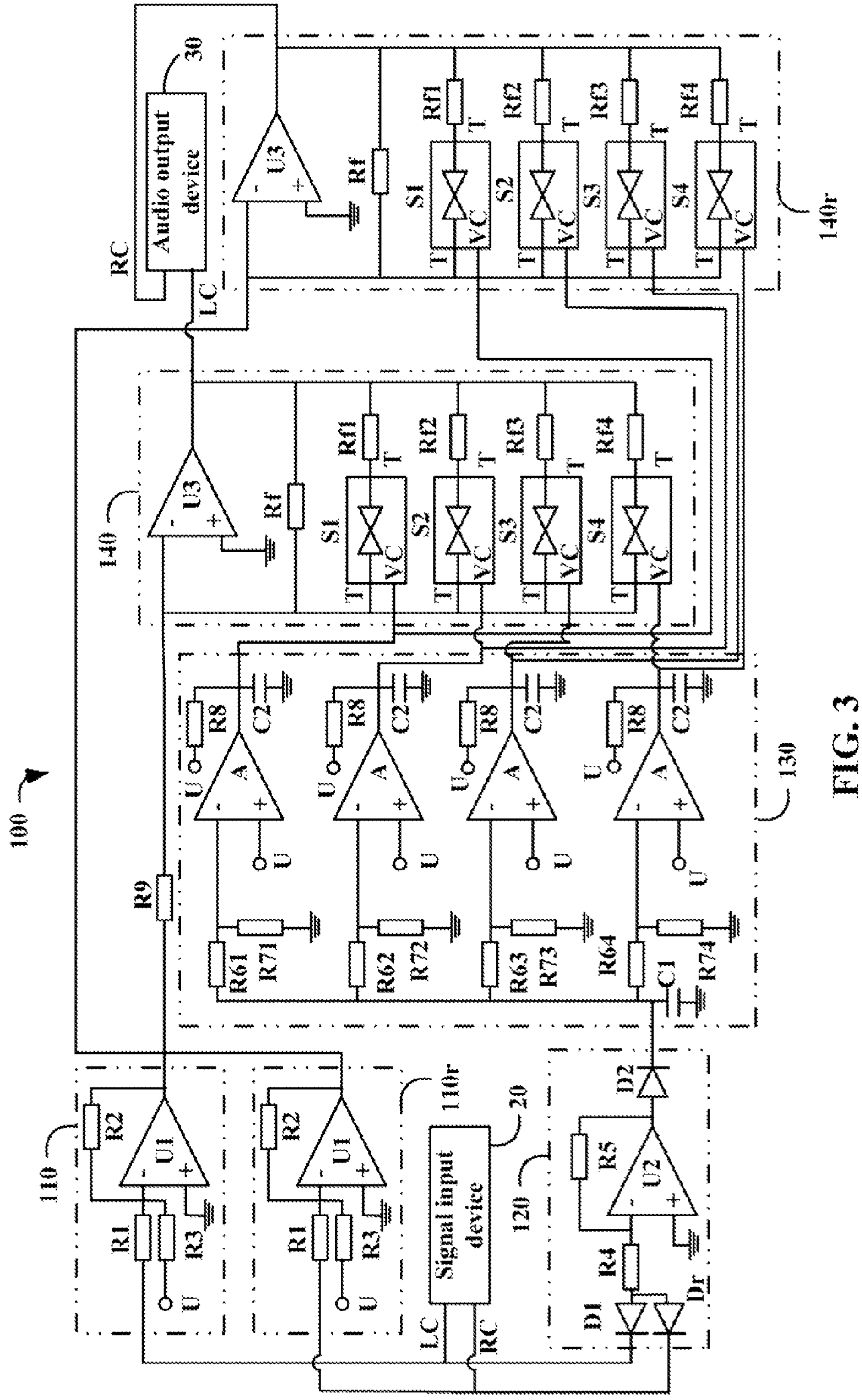
FIG. 3 is a circuit diagram of another exemplary embodiment of an audio processing system

It also should be understood that, the above disclosed circuit of the audio processing system 100 is for processing audio signal of a single channel. However, the audio processing system 100 also can process audio signal of multiply channels. In one example and with reference to FIG. 3, if the audio signal has two channels: for example, a left channel (LC) and a right channel (RC), one more DC offset unit 110*r*, first diode Dr, and gain control unit 140*r* can be employed to cooperating with the sampling unit 120 and the triggering unit 130 to process the RC of the audio signal.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. An audio processing system connected to a signal input device and an audio output device, the audio processing system comprising:

a gain control unit configured for receiving and amplifying an audio signal from the signal input device and outputting the amplified audio signal to the audio output device;

a sampling unit configured for sampling the audio signal;

a triggering unit configured for triggering a gain reduction signal if the amplitude of the sampled audio signal exceeds a predetermined value for a predetermined time period;

wherein the predetermined value is set so that when the amplitude of the sampled audio signal exceeds the predetermined value over the predetermined time period, the amplified audio signal exceeds a predetermined range, the gain control unit being configured for reducing the gain of the gain control unit, according to the gain reduction signal, to limit the amplitude of the amplified audio signal within the predetermined acceptable range.

2. The audio processing system of claim 1, wherein the gain control unit is an inverse feedback amplifying circuit, the voltage of the audio signal is about zero, the predetermined acceptable range is in a positive voltage range, the audio processing system further comprises a direct current (DC) offset unit, and the DC offset unit is configured for offsetting the audio signal to a negative voltage range so that the amplified audio signal by the gain control unit is mainly within the predetermined acceptable range.

3. The audio processing system of claim 2, wherein audio signal comprises a plurality of channels, and the audio processing system comprises a plurality of DC offset units and gain control unit, each DC offset unit and gain control unit corresponding to a channel of the audio signal.

4. The audio processing system of claim 2, wherein the DC offset unit comprises a first amplifier, a first resistor, a second resistor, and a third resistor, and the negative input of the first amplifier is connected to the signal input device through the first resistor, and connected to the output of the first amplifier through the second resistor, and connected to a DC voltage input.

5. The audio processing system of claim 2, wherein the sampling unit comprises a second amplifier, a first diode, a second diode, a fourth resistor, a fifth resistor, the negative input of the second amplifier is connected to the signal input device through the fourth resistor and the first diode, wherein the cathode of the first diode is directly connected to the signal input device, the negative input of the second amplifier is also connected to the output of the second amplifier through the fifth resistor, the positive input of the second amplifier is grounded, and the output of the second amplifier is connected to the anode of the second diode.

6. The audio processing system of claim 5, wherein the audio signal comprises a plurality of channels, the sampling unit comprising a plurality of first diodes, each first diode is disposed in a corresponding channel of the audio signal, wherein cathodes of the first diodes are directly connected to the signal input device and anodes of the first diodes are connected to the negative input of the second amplifier.

7. The audio processing system of claim 1, wherein the gain control unit is configured for reducing the gain of the gain control unit by an increment if the amplitude of the sampled audio signal increases by a corresponding increment.

8. The audio processing system of claim 1, wherein the triggering unit comprises a first capacitor, a plurality of sixth resistor, a plurality of seventh resistors, a plurality of comparators, a plurality of eighth resistors, and a plurality of second capacitors, the first capacitor interconnects the sampling unit and the ground, the negative input of each comparator is connected to the sampling unit through a corresponding sixth resistor, and connected to the ground through a corresponding seventh resistor, the positive input of each comparator is connected to a DC voltage input, and the output of each comparator is connected to the DC voltage input through a corresponding eighth resistor, and connected to the ground through a corresponding second capacitor.

9. The audio processing system of claim 1, wherein the gain control unit comprises a third amplifier, a basic feedback resistor, a plurality of four controllable switches, and a plurality of additional feedback resistors, the negative input of the third amplifier is connected to the signal input device through a ninth resistor, and connected to the output of the third amplifier through the basic feedback resistor, the positive input of the third amplifier is grounded, each controllable switch comprises two connection terminals and a control terminal, the two connection terminals of each controllable switch electrically connect when a corresponding control terminal receives a logic high level, and disconnect when the corresponding control terminal receives a logic low level, one connection terminal of each controllable switch is connected to the negative input of the third amplifier, and the other connection terminal is connected to the output of the third amplifier through a corresponding additional feedback resistor, the control terminal of each controllable switch is connected to the triggering unit.

* * * * *